United States Patent
Harb et al.

(10) Patent No.: US 11,545,998 B2
(45) Date of Patent: Jan. 3, 2023

(54) OFFSET VALUE DETERMINATION IN A CHECK NODE PROCESSING UNIT FOR MESSAGE-PASSING DECODING OF NON-BINARY CODES

(71) Applicant: UNIVERSITE DE BRETAGNE SUD, Lorient (FR)

(72) Inventors: Hassan Harb, Tibnin (LB); Emmanuel Boutillon, Lorient (FR); Cédric Marchand, Queven (FR)

(73) Assignee: UNIVERSITE DE BRETAGNE SUD

( * ) Notice: Subject to any disclaimer, the term of this patent is extended or adjusted under 35 U.S.C. 154(b) by 0 days.

(21) Appl. No.: 17/276,255

(22) PCT Filed: Oct. 7, 2019

(86) PCT No.: PCT/EP2019/076993
§ 371 (c)(1),
(2) Date: Mar. 15, 2021

(87) PCT Pub. No.: WO2020/074404
PCT Pub. Date: Apr. 16, 2020

(65) Prior Publication Data
US 2022/0038116 A1 Feb. 3, 2022

(30) Foreign Application Priority Data
Oct. 8, 2018 (EP) .................................... 18306325

(51) Int. Cl.
*H03M 13/11* (2006.01)
*H03M 13/00* (2006.01)

(52) U.S. Cl.
CPC ........ *H03M 13/112* (2013.01); *H03M 13/114* (2013.01); *H03M 13/1171* (2013.01); *H03M 13/612* (2013.01)

(58) Field of Classification Search
CPC ........... H03M 13/1171; H03M 13/112; H03M 13/114; H03M 13/612; H03M 13/6583;
(Continued)

(56) References Cited

U.S. PATENT DOCUMENTS

| 8,429,483 | B1 * | 4/2013 | Varnica | ............. | H03M 13/6516 |
| | | | | | 714/752 |
| 2013/0019141 | A1 * | 1/2013 | Wang | ................. | H03M 13/1117 |
| | | | | | 714/763 |

(Continued)

FOREIGN PATENT DOCUMENTS

| EP | 3242405 A1 | 5/2016 |
| EP | 3419179 A1 | 6/2017 |
| EP | 3316486 A1 | 5/2018 |

OTHER PUBLICATIONS

E. Boutillon and L. Conde-Canencia, "Simplified check node processing in nonbinary LDPC decoders," 2010 6th International Symposium on Turbo Codes & Iterative Information Processing, Brest, France, 2010, pp. 201-205.*

(Continued)

*Primary Examiner* — Steve N Nguyen
(74) *Attorney, Agent, or Firm* — Meagher Emanuel Laks Goldberg & Liao, LLP

(57) ABSTRACT

Embodiments of the invention provide an elementary check node processing unit (300) implemented in a check node processing unit of a non-binary error correcting code decoder, the elementary check node processing unit (300) being linked to a variable node processing unit (305) and being configured to receive a first message and a second message, each message comprising at least two components. The elementary check node processing unit (300) comprises a calculation unit (301) which determines two or more auxiliary components from the components comprised in the first message and from the components comprised in the
(Continued)

second message, an auxiliary component comprising an auxiliary reliability metrics. The calculation unit (301) also determines, in association with each of the two or more auxiliary components, decoding performance values. The elementary check node processing unit (300) also comprises a selection unit (303) which selects, among the two or more auxiliary components, the auxiliary component that is associated with the optimal decoding performance values and determines an offset value from the auxiliary reliability metrics comprised in the selected auxiliary component. The elementary check node processing unit (300) then transmits the offset value and a selected set of auxiliary components among the two or more auxiliary components to the variable node processing unit (305).

10 Claims, 4 Drawing Sheets

(58) Field of Classification Search
CPC .......... H03M 13/1111; H03M 13/6591; H03M 13/1117
See application file for complete search history.

(56) References Cited

U.S. PATENT DOCUMENTS

| | | | |
|---|---|---|---|
| 2015/0349801 A1 | 12/2015 | Park et al. | |
| 2016/0233978 A1* | 8/2016 | Kim | H04L 1/005 |
| 2016/0336967 A1* | 11/2016 | Boutillon | H03M 13/1171 |
| 2017/0093428 A1* | 3/2017 | Yen | H03M 13/35 |
| 2017/0163288 A1* | 6/2017 | Tate | H03M 13/1131 |

OTHER PUBLICATIONS

O. Abassi, L. Conde-Canencia, A. Al Ghouwayel and E. Boutillon, "A Novel Architecture for Elementary-Check-Node Processing in Nonbinary LDPC Decoders," in IEEE Transactions on Circuits and Systems II: Express Briefs, vol. 64, No. 2, pp. 136-140, Feb. 2017.*
I. Choi and J.-H. Kim, "High-Throughput Non-Binary LDPC Decoder Based on Aggressive Overlap Scheduling," in IEEE Transactions on Circuits and Systems I: Regular Papers, vol. 64, No. 7, pp. 1937-1948, Jul. 2017.*
R. Singhal, Gwan Choi and R. N. Mahapatra, "Programmable LDPC decoder based on the bubble-sort algorithm," 19th International Conference on VLSI Design held jointly with 5th International Conference on Embedded Systems Design (VLSID'06), Hyderabad, India, 2006, pp. 6 pp.-.*
E. Boutillon and L. Conde-Canencia, "Bubble check: A simplified algorithm for elementary check node processing in extended min-sum non-binary LDPC decoders," in Electronics Letters, vol. 46, No. 9, Apr. 2010.*
International Search Report and Written Opinion for PCT/EP2019/076993, dated Dec. 18, 2019.
Cedric Marchand et al, "Extended-Forward Architecture for Simplified Check Node Processing in NB-LDPC Decoders Extended-Forward Architecture for Simplified Check Node Processing in NB-LDPC Decoders", Oct. 10, 2017 (Oct. 10, 2017).
Adrian Voicila et al, "Low-complexity decoding for non-binary LDPC codes in high order fields", IEEE Transactions on Communications, IEEE Service Center, Piscataway, NJ. USA, vol. 58, No. 5, May 1, 2010 (May 1, 2010), p. 1365-1375.
Boutillon Emmanuel et al, "Design of a GF(64)-LDPC Decoder Based on the EMS Algorithm", vol. 60, No. 10, p. 2644-2656, Oct. 1, 2013 (Oct. 1, 2013).
L. Barnault et al., "Fast decoding algorithm for LDPC over GF(q)", Proceedings of IEEE Information Theory Workshop, pp. 70-73, Apr. 2003.
V. Savin, "Min-max decoding for non-binary LDPC codes", Proceedings of IEEE International Symposium on Information Theory, pp. 960-964, Jul. 2008.
D. Declercq et al., "Decoding algorithms for non-binary LDPC codes over GF(q)", IEEE Transactions on Communications, vol. 55, No. 4, pp. 633-643, Apr. 2007.
J. O. Lacruz, et al., "One Minimum Only Trellis Decoder for Non-Binary Low-Density Parity-Check Codes", IEEE Transactions on Circuits and Systems I: Regular Papers, vol. 62, No. 1, pp. 177-184, Jan. 2015.
E. Li et al., "Low latency T-EMS decoder for non-binary LDPC codes", 2013 Asilomar Conference on Signals, Systems and Computers, Pacific Grove, CA, 2013, pp. 831-835.
Korb et al., "Non-binary LDPC codes over finite division near rings", 23rd International Conference on Telecommunications (ICT), pp. 1-7, 2016.

* cited by examiner

OFFSET VALUE DETERMINATION IN A CHECK NODE PROCESSING UNIT FOR MESSAGE-PASSING DECODING OF NON-BINARY CODES

TECHNICAL FIELD

The invention generally relates to digital communications, and in particular to methods and devices for decoding a signal encoded using a non-binary error correcting code.

BACKGROUND

Error correcting codes are implemented in various data processing systems and devices for ensuring a protection of data against errors that are introduced during data transmission or storage in the presence of noise and/or interference. Coding consists in adding redundant data to the original data, the redundant data enabling the detection and/or the correction of errors.

Error correcting codes can be categorized into two classes: linear codes and non-linear codes. Linear error correcting codes are particularly advantageous given their low implementation complexity compared with the non-linear codes. Exemplary linear error correcting codes comprise convolutional codes and linear block codes such as Hamming codes, Reed-Solomon codes, Turbo codes, Polar codes, and Low-Density Parity-Check (LDPC) codes.

LDPC codes, in particular, are very efficient. Non-binary LDPC codes are proven to perform close to the Shannon limit; they provide high transmission rates that approach the maximum amount of information that can be transmitted over a transmission channel. Non-binary LDPC codes are very efficient in providing high-spectral efficiency coding and perform better than binary LDPC codes. However, in order to reach such gains, developing low-complexity decoding algorithms for non-binary codes is required, especially for high spectral efficiency communications.

Decoding of signals encoded using linear block codes in general, and LDPC codes in particular, can be performed using iterative message passing algorithms. Message passing algorithms use a graph representation of the code used to decode data, called 'Tanner graph'. The Tanner graph comprises two sets of nodes referred to as 'variable nodes' and 'check nodes'. Each variable node is associated with a column of the parity-check matrix of the code. Each check node is associated with a row of the parity-check matrix, i.e. with a parity-check equation. Variable nodes and check nodes are connected via edges. The connections between variable nodes and check nodes are determined by the non-zero entries of the parity-check matrix.

Message passing algorithms are based on exchanging messages representative of the encoded data between check node processing units and variable node processing units associated with the Tanner graph representation of the used code. The decoding process comprises variable node update by computing variable node messages, check node update by computing check node messages, and codeword decision making. Exemplary decoding algorithms for non-binary codes, such as non-binary LDPC codes, comprise:
- the 'q-array sum-product' algorithm disclosed for example in "L. Barnault and D. Declercq, Fast decoding algorithm for LDPC over GF(q), In Proceedings of IEEE Information Theory Workshop, pages 70-73, April 2003";
- the 'Thin-max' algorithm disclosed for example in "V. Savin, Min-max decoding for non-binary LDPC codes, In Proceedings of IEEE International Symposium on Information Theory, pages 960-964, July 2008";
- the 'extended min-sum' (EMS) algorithm disclosed for example in "D. Declercq and M. Fossorier, Decoding algorithms for non-binary LDPC codes over GF, IEEE Transactions on Communications, vol, 55, no. 4, pages 633-643, April 2007", and
- the 'Trellis EMS decoder' (T-EMS) disclosed for examples in "J. O. Lacruz, F. Garcia-Herrero, J. Valls and D. Declercq, One Minimum Only Trellis Decoder for Non-Binary Low-Density Parity-Check Codes, in IEEE Transactions on Circuits and Systems I: Regular Papers, vol. 62, no. 1, pages 177-184, January 2015" and "E. Li, F. Garcia-Herrero, D. Declercq, K. Gunnam, J. O. Lacruz and J. Valls, "Low latency T-EMS decoder for non-binary LDPC codes," 2013 Asilomar Conference on Signals, Systems and Computers, Pacific Grove, Calif., 2013, pp. 831-835".

The EMS algorithm is based on logarithmic-scale computations for reducing the computational complexity by transforming product operations to simple summation operations. Compared with other existing iterative decoding algorithms, the EMS algorithm gives a good trade-off between hardware complexity and communication performance. Nevertheless, the EMS algorithm still requires significant computational and storage resources which may not be available in practical devices or systems used for example in real-time applications or in systems which demand high throughput and a significantly reduced latency.

The largest computational complexity involved during the decoding process using the EMS algorithm stems from the computations performed at the check node processing units and the variable node processing units. There is accordingly a need for low-complexity variable node and check node processing architectures capable of achieving optimal decoding performance while requiring low computational complexity.

SUMMARY

In order to address these and other problems, there is provided an elementary check node processing unit implemented in a check node processing unit of a non-binary error correcting code decoder, the elementary check node processing unit being linked to a variable node processing unit and being configured to receive a first message and a second message, each of the first message and second message comprising at least two components. The elementary check node processing unit may comprise:
- a calculation unit configured to determine two or more auxiliary components from the components comprised in the first message and the components comprised in the second message, an auxiliary component comprising an auxiliary reliability metrics; and decoding performances values, in association with each of the two or more auxiliary components;
- a selection unit configured to select, among the two or more auxiliary components, the auxiliary component that is associated with the optimal decoding performance values, and determine an offset value from the auxiliary reliability metrics comprised in the selected auxiliary component.

The elementary check node processing unit is further configured to transmit the offset value and a selected set of auxiliary components among the two or more auxiliary components to the variable node processing unit.

In one embodiment, the decoding performance values may comprise a bit error rate evaluated for a given signal-to-noise ratio.

In some embodiments, the first message may comprise a first predefined number of components and the second message may comprise a second predefined number of components, each component of the first message and of the second message comprising a symbol and a reliability metrics associated with the symbol, the calculation unit being configured to determine each auxiliary component among the auxiliary components from a component comprised in the first message and a component comprised in the second message, an auxiliary component further comprising an auxiliary symbol.

Advantageously, the calculation unit may be configured to determine the auxiliary symbol comprised in each auxiliary component by applying a first addition operation over an algebraic structure of construction of the non-binary error correcting code, the first addition operation being applied to a symbol comprised in a component of the first message and a symbol comprised in a component of the second message. The calculation unit may be further configured to determine the auxiliary reliability metrics associated with each auxiliary symbol by applying a second addition operation over a predefined algebraic structure, the second addition operation being applied to a reliability metrics associated with a symbol comprised in a component of the first message and a reliability metrics associated with a symbol comprised in a component of the second message.

The predefined algebraic structure may be chosen in a group comprising the field of real numbers, the field of integer numbers, and the field of natural numbers.

In one embodiment, the first given number of components and the second given number of components may be equal.

In some embodiments, the first given number of components and the second given number of components may be different.

In one embodiment, the check node processing unit may be configured to exchange two or more variable node messages with at least one variable node processing unit implemented in the non-binary error correcting code decoder during a number of message exchange iterations, the elementary check node processing unit being configured to previously determine the number of auxiliary components depending on at least one parameter chosen in a group comprising the number of message exchange iterations, an algebraic structure of construction of the non-binary error correcting code, a signal-to-noise ratio, one or more of a first predefined number of components of the first message or a second predefined number of components of the second message, and a position of the elementary check node processor within the check node processing unit.

In some embodiments, the elementary check node processing unit may be implemented in the check node processing unit according to a forward-backward architecture.

There is further provided a method for determining an offset value in an elementary check node processing unit implemented in a check node processing unit of a non-binary error correcting code decoder, the elementary check node processing unit being linked to a variable node processing unit and being configured to receive a first message and a second message, each of the first message and second message comprising at least two components, wherein the method may comprise:

determining two or more auxiliary components from the components comprised in the first message and the components comprised in the second message, an auxiliary component comprising an auxiliary reliability metrics;

determining, in association with each of the two or more auxiliary components, decoding performance values;

selecting, among the two or more auxiliary components, the auxiliary component that may be associated with the optimal decoding performance values, and determining an offset value from the auxiliary reliability metrics comprised in the selected auxiliary component.

The method may further comprise transmitting the offset value and a selected set of auxiliary components among the two or more auxiliary components to the variable node processing unit.

Advantageously, the embodiments of the invention provide simplified and low-complexity designs of elementary check node processing units implemented in check node processing unit.

Advantageously, the embodiments of the invention provide low-complexity techniques for determining optimized offset values used during the variable node update step of iterative decoding algorithms enabling reaching optimal decoding performance.

BRIEF DESCRIPTION OF THE DRAWINGS

The accompanying drawings, which are incorporated in and constitute a part of this specification, are provided for illustration purposes only and they illustrate various embodiments of the invention together with the general description of the invention given above, and the detailed description of the embodiments given below.

DETAILED DESCRIPTION

Embodiments of the invention provide devices and methods for determining an offset value and a check node message at an elementary check node processing unit implemented in a check node processing unit of a non-binary error correcting code decoder used to decode signals encoded using a non-binary error correcting code.

The non-binary error correcting code decoder implementing the devices and methods according to the various embodiments may be implemented in several types of digital data transmission and storage devices and systems used in several types of applications. Exemplary devices and systems comprise, but are not limited to, computers, disks, laptops, phones, smart-phones, recorders, base stations, drones, satellites, Internet of Things devices (IoT), embedded devices or the like. Exemplary applications comprise magnetic and optical recording, digital television and video broadcasting, and digital communications.

The following description of some embodiments of the invention will be made with reference to digital communication systems, for illustration purposes only. However, the skilled person will readily understand that the various embodiments of the invention may be integrated in other types of systems, used for other applications such as positioning systems, memory and storage systems, and spacecraft systems.

Figure 1:
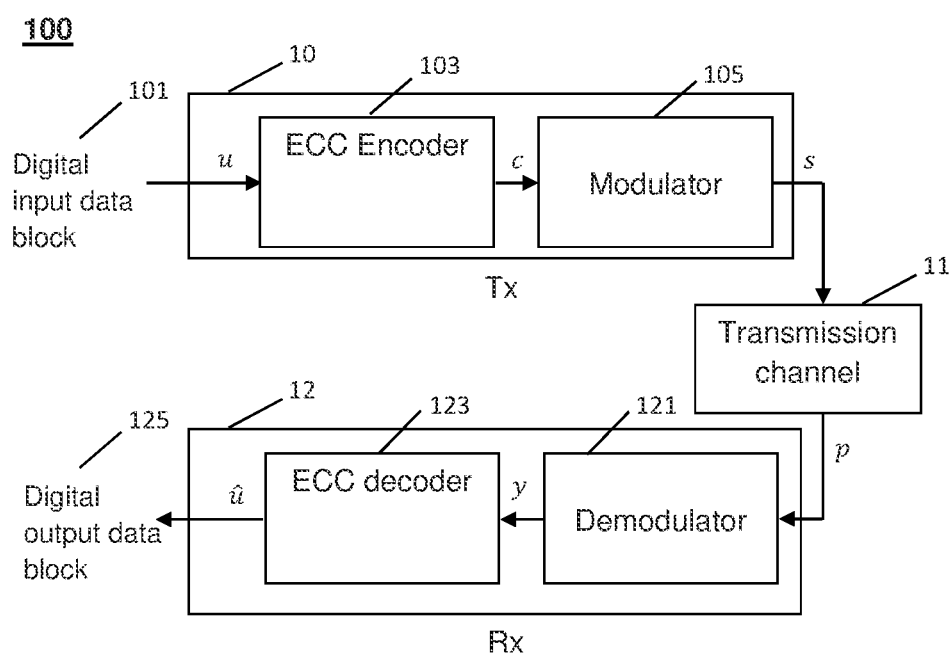
FIG. 1 is a block diagram of an exemplary operational environment in which embodiments of the invention may be implemented.

Referring to FIG. 1, there is shown an exemplary operational environment in which embodiments of the invention may be implemented. The exemplary operational environment of FIG. 1 corresponds to a digital communication system 100. The communication system 100 may be for example:
- wired;
- wireless (e.g. radio or Visible Light communication systems);
- optical (e.g. optical fiber-based, laser-based);
- acoustic (e.g. underwater acoustic communication systems);
- molecular (used for example in underground structures, e.g. tunnels and pipelines or in underwater environments).

The communication system 100 may comprise at least a transmitter device 10 and a receiver device 12. The transmitter device 10 (also referred to hereinafter as a "transmitter") may be configured to communicate data information to the receiver device 12 (also referred to hereinafter as "receiver") via the transmission channel 11.

In an application of the invention to wired communication systems such as computer networking systems, the transmitter 10 and/or receiver 12 may be any device configured to operate in a wired network. Exemplary devices in such applications comprise computers, routers or switches connected to a small or large area wired network. The transmission channel 11 may be in this case any type of physical cable used to ensure the transfer of data between the different connected devices.

In an application of the invention to wireless communication systems such as ad-hoc wireless networks, wireless sensor networks, and radio communication systems, the transmitter 10 and receiver 12 may be any type of fixed or mobile wireless device configured to operate in a wireless environment. Exemplary devices in such applications comprise laptops, mobile phones, base stations and any computer device. The transmission channel 11 may be in this case any wireless propagation medium. Further, the transmission channel 11 may accommodate several transmitters 10 and/or several receivers 12. In such embodiments, multiple access techniques and/or network coding techniques may be used in combination with error correcting codes. Exemplary multiple access techniques comprise Time Division Multiple Access (TDMA), Frequency Division Multiple Access (FDMA), Code Division Multiple Access (CDMA), and Space Division Multiple Access (SDMA).

In an application of the invention to optical communication systems such as optical fiber-based systems, the transmitter 10 and receiver 12 may be any optical transceiver devices configured to respectively transmit and receive data information propagated over an optical link. The transmission channel 11 may be any optical fiber link designed to carry data over short or long distances. Exemplary applications using optical fiber links over short distances comprise high-capacity networks such as data center interconnections. Exemplary applications using optical fiber links over long distances comprise terrestrial and transoceanic transmissions. In such embodiments, the information symbols conveyed by the transmitter 10 may be carried by optical signals polarized according to the different polarization states of the fiber. The optical signals propagate along the fiber-based transmission channel 11, according to one or more propagation modes, until reaching the receiver 12. Exemplary optical communication systems comprise Polarization Division Multiplexing (PDM) and Mode Division Multiplexing (MDM) systems.

For any type of wired, wireless or optical communication systems, the transmission channel 11 may be any noisy channel. The noise may result from the thermal noise of the system components or the interfering radiation intercepted by antennas. Other exemplary sources of noise comprise switching, manual interruptions, electrical sparks and lightning. In some embodiments, the total noise may be modeled by an Additive White Gaussian Noise (AWGN).

Further, according to some embodiments applied to digital mass storage, the transmission channel 11 may be modeled for example by an erasure channel, a binary symmetric channel, or a Gaussian channel. In such embodiments, the transmission channel 11 may be any type of storage device that can be sent to (written on) and received from (read).

In addition, the transmitter 10 and receiver 12 may be equipped with single or multiple antennas. In particular, in the presence of multiple transmit and/or receive antennas, Space-Time coding and decoding techniques may be used in combination with error correcting coding and decoding.

Further, encoded data may be transmitted over one or multiple frequency bands. When encoded data are transmitted over multiple frequency bands, the modulator 105 may use multi-carrier modulation formats such as OFDM (acronym for Orthogonal Frequency Division Multiplexing) and FBMC (acronym for Filter Bank Multi-Carrier).

According to some embodiments of the invention, the transmitter 10 comprises an error correcting code (ECC) encoder 103, configured to encode a digital input data block 101 denoted u using a non-binary error correcting code into a codeword vector denoted c. The receiver 12 may be configured to receive a noisy copy p of the encoded data, or codeword vector, through the transmission channel 11. The receiver 12 may comprise an error correcting code decoder 123 configured to deliver a digital output data block 125 as an estimate $\hat{u}$ of the original digital input data block 101.

The digital input data 101 may be previously compressed before being encoded by the ECC encoder 103. Any source coding scheme (not shown in FIG. 1) adapted to increase the information throughput may be used to perform the compression. Data encoded by the ECC encoder 103 may be further modulated by a modulator 105. The modulator 105 may be configured to map the encoded data onto an analog signal s and to send it through the transmission channel 11.

The receiver 12 may comprise homologous processing blocks configured to perform the reverse functions. The receiver 12 may comprise a demodulator 121, configured to generate a signal y, by performing a demodulation of the received signal p from the transmission channel prior to ECC decoding by the ECC decoder 123. The demodulator 121 may be configured to move the received signal or channel output back into baseband and perform low-pass filtering, sampling and quantization. The data decoded by the ECC decoder 123 may be further decompressed using any source decoder (not shown in FIG. 1). The ECC decoder 123 may be configured to implement an iterative decoder (referred to as 'iterative decoding algorithm') involving check node processing units and variable node processing units according to the various embodiments of the invention.

The following description of some embodiments of the invention will be made with reference to linear block non-binary error correcting codes, for illustration purposes only. However, the skilled person will readily understand that the various embodiments of the invention apply to any linear non-binary error correcting codes comprising non-binary convolutional codes.

Accordingly, the ECC encoder 103 may implement a linear block non-binary error correcting code designated by $\mathcal{C}$ (n,K); n and K referring respectively to the length of codeword vectors and the length of the encoded data block. The ECC encoder 103 encodes accordingly a data block u of length K into a codeword vector c, with $c=(c_1, \ldots, c_n)$ being a vector comprising n elements of the algebraic structure of construction of the error correcting code $\mathcal{C}$ (n,K), also referred to as "symbols".

A linear code $\mathcal{C}$ (n,K) may be represented in a matrix form using a generator matrix denoted by G and a parity-check matrix denoted by H. Using a row notation of vectors, the generator matrix G is of dimensions K×n while the parity-check matrix has dimensions of (n−K)×n. The two matrices are linked by the relation $G \cdot H^t = 0$. In addition, entries of both matrices belong to the algebraic structure over which the error correcting code is constructed. Using the matrix representation, any codeword vector c satisfies the equation $c \cdot H^t = 0$. This equation is also called "parity-check equation". It defines (n−K) parity-check constraints, designed to be satisfied by any codeword vector.

In association with the matrix representation, the linear code $\mathcal{C}$ (n,K) may be represented using the Tanner graph denoted by $\mathcal{H}$. This graph comprises n variable nodes and n−K check nodes.

Each variable node $vn \in \{1, 2, \ldots, n\}$ corresponds to a column of the parity-check matrix. Each check node $cn \in \{1, 2, \ldots, n-K\}$ corresponds to a row of the parity-check matrix, i.e. to a parity-check equation. A variable node vn is connected to a check node cn if the entry $H_{vn,cn}$ of the parity-check matrix is equal to a non-null element of the algebraic structure of construction of the code $\mathcal{C}$ (n,K).

$\mathcal{H}_v(vn)$ denotes the set of the check nodes connected to the variable node vn. Similarly, $\mathcal{H}_c(cn)$ denotes the set of the variable nodes connected to the check node cn.

The degree $d_{VN}$ of a variable node vn (respectively $d_{CN}$ of a check node cn) corresponds to the cardinality of the set $\mathcal{H}_v(vn)$ (respectively the cardinality of the set $\mathcal{H}_c(cn)$).

According to some embodiments, the algebraic structure of construction of the non-binary error correcting code $\mathcal{C}$ (n,K) may be any non-zero commutative division ring, such as 'Galois fields'.

The following description of some embodiments will be made with reference to finite fields, for illustration purposes only. However the skilled person will readily understand that the invention may be applied to any division rings-like algebraic structures such as non-zero commutative division rings and to any near-rings such as finite division near-rings. Insights on the design of non-binary error correcting codes over finite division near-rings can be found in the article "Non-binary LDPC codes over finite division near rings, 23rd International Conference on Telecommunications (ICT), pp. 1-7, Thessaloniki, 2016".

For non-binary linear codes constructed over Galois Fields, generally denoted by GF(q), where q>2 designates the cardinality of the code, the symbols take values in GF(q). A codeword vector c is thus a vector of n symbols that each belong to GF(q).

The following description of some embodiments will be made with reference to an ECC encoder 103 encoding data using a non-binary LDPC code, for illustration purposes only. However, the skilled person will readily understand that the various embodiments of the invention also apply to other non-binary codes such as non-binary polar codes, non-binary convolutional codes, non-binary turbo codes, and in general to non-binary linear block error correcting codes. Non-binary error correcting codes can advantageously be used for high spectral efficiency coding.

For exemplary purposes, in one embodiment, the ECC decoder 123 implements a non-binary LDPC codes decoder for decoding the data encoded by the ECC encoder 103, using a non-binary LDPC code.

The description of the invention is made with reference to the EMS algorithm. However, the skilled person will readily understand that the various embodiments apply to any iterative non-binary LDPC codes decoder such as the min-max.

Figure 2:
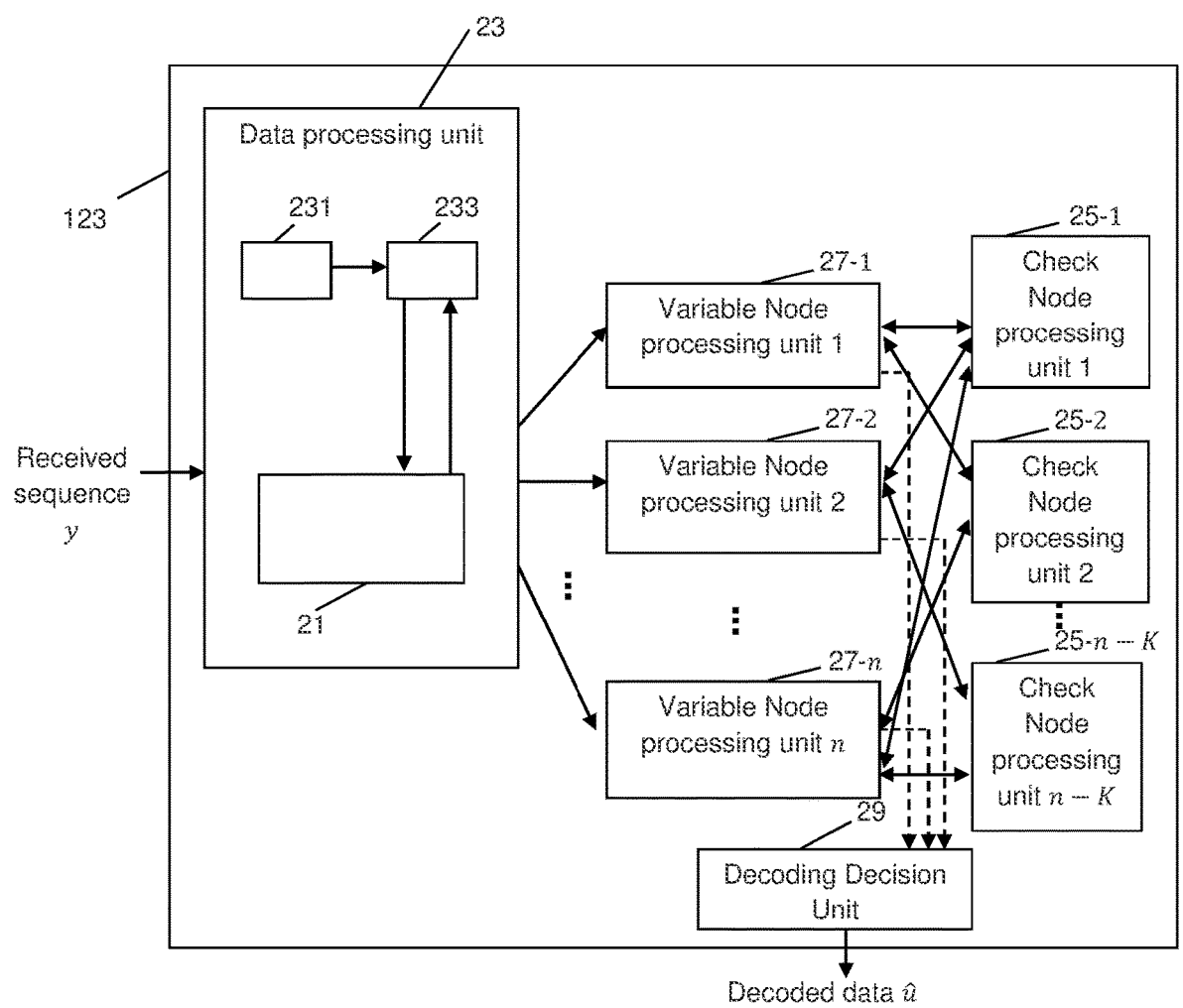
FIG. 2 is a block diagram of a non-binary error correcting code decoder, according to some embodiments in which the EMS decoding algorithm is considered.

Referring to FIG. 2, there is illustrated a structure of an iterative non-binary LDPC decoder 123 according to some embodiments using the EMS algorithm.

For ease of presentation of the various embodiments of the invention, the following definitions will be used in the remaining of the description.

An elementary check node-based architecture refers to any implementation architecture of a check node processing unit that comprises one or more elementary check node processors.

A message generated by a variable node processing unit 27-vn is referred to as a 'variable node message'. A message generated by a check node processing unit 25-cn is referred to as a 'check node message'.

The variable node messages and check node messages may comprise components carrying data representative of the symbols. The components comprised in a variable node message are referred to as 'variable node components' and the components comprised in a check node message are referred to as 'check node components'.

An intrinsic message refers to a message comprising components referred to as intrinsic components, each intrinsic component comprising an intrinsic symbol and an intrinsic reliability metrics associated with the intrinsic symbol. The intrinsic reliability metrics are computed from the received sequence only. The wording 'intrinsic' refers accordingly to the dependence of the intrinsic reliability metrics only on the (transmission) channel.

The first message and the second message processed by an elementary check node processor refer to messages derived from the variable node messages received by the check node processing unit in which the elementary check node processing unit is implemented. The first message comprises a first predefined number of components and the second message comprises a second predefined number of components.

An elementary check node message refers to a message computed by an elementary check node processor from a first message and a second message. The components of an elementary check node message are referred to as elementary check node components.

An auxiliary component (also referred to as 'a bubble') refers to a component determined by an elementary check node processor from a component comprised in a first message and a component comprised in a second message.

An auxiliary component comprises an auxiliary symbol and an auxiliary reliability metrics associated with the auxiliary symbol.

The iterative decoder 123 may be configured to determine an estimate û of the transmitted codeword c by the transmitter 10 from a received noisy sequence represented by a vector $y=(y_1, \ldots, y_n)$. The codeword $c=(c_1, \ldots, c_n)$ may have been encoded at the transmitter using a non-binary LDPC code designated by $\mathcal{C}(n,K)$ constructed over the Galois Field GF(q) with q>2. It may process a signal over several iterations trying, at each iteration, to reduce the remaining errors.

The iterative decoder 123 may be configured to determine the estimate û based on the Tanner graph representation of the code $\mathcal{C}(n,K)$ used at the transmitter 10. Each variable node in the Tanner graph maps to a variable node processing unit. Each check node in the Tanner graph maps to a check node processing unit.

Accordingly, the iterative decoder 123 may comprise n variable node processing units 27 (also denoted by 27-1 to 27-*n* or 27-*vn* with vn=1, ..., n) and n−K check node processing units 25 (also denoted by 25-1 to 25-(*n*−K) or 25-*cn* with cn=1, n−K).

The variable node processing units 27-*vn* for vn=1, ..., n and check node processing units 25-*cn* for cn=1, ..., n−K may be configured to iteratively exchange variable node messages and check node messages during a number of message exchange iterations to estimate the most reliable codeword û from the noisy sequence y.

According to some embodiments, the variable node and check node components comprised respectively in the variable node messages and the check node messages may carry values of the symbols and metrics measuring their reliabilities (also referred to hereinafter as 'reliability metrics'). The value of the reliability metrics is related to the reliability of the symbol. In such embodiments, each variable node message (respectively check node message) may comprise q variable node components (respectively check node components), a component (check node component or variable node component) comprising:

- a value of a symbol in GF(q), and
- a reliability metrics associated with the symbol.

In some embodiments, the reliability metrics of a symbol may correspond to an estimated probability density function of the symbol which represents the probability that the symbol is correct. In particular, the reliability metrics may be represented in the log-domain by a logarithmic likelihood ratio (LLR) value.

Depending on the expression of the reliability metrics, the most reliable symbols may be associated with the smallest or the greatest values of the reliability metrics.

One definition of the LLR metric involves a fixed symbol denoted by $\beta_i$ and corresponding to the most reliable symbol satisfying:

$$\beta_i = \underset{t=0,\ldots,q-1}{\mathrm{argmax}}\ p(\alpha_t | y_i) \qquad (1)$$

In equation (1), $\alpha_t$ designates a symbol over the Galois field.

Accordingly, with the hypothesis that the symbols in the Galois field are equiprobable, for the $i^{th}$ symbol $c_i$, the LLR value for this symbol to be equal to $\alpha_t$ is noted $LLR_t(c_i)$ and may be expressed as:

$$LLR_t(c_i) = -\log\left(\frac{p(c_i = \alpha_t | y_i)}{p(c_i = \beta_i | y_i)}\right) \qquad (2)$$

Using such definition of the LLR metrics, the most reliable symbols are those that are associated with the smallest LLR values according to equation (2).

The following description of some embodiments will be made with reference to reliability metrics represented in the logarithm domain by log-likelihood ratio (LLR) values, for illustration purposes only. However, the skilled person will readily understand that other types of decoding and reliability metrics may be used to measure the reliability of symbols. For instance, the reliability metrics may be a quadratic distance or any monotonic function of the probability density function of symbols.

According to some embodiments using the EMS algorithm, the variable node messages and/or the check node messages may be sorted according to their reliability i.e. according to a given order (for example increasing or decreasing) of the reliability metrics comprised in the variable node components and the check node components. Further, the variable node messages may be truncated so as to keep only a predefined number $n_{VN}$ of the variable node components comprising the most reliable symbols, with $n_{VN}$ being strictly lower than q. Similarly, the check node messages may be truncated so as to keep only a predefined number $n_{CN}$ of the check node components comprising the most reliable symbols, with $n_{CN}$ being strictly lower than q. Further, the sorting and truncation operations may be performed by the variable node processing units 27-*vn* or by the check node processing units 25-*cn*.

In an embodiment, the predefined number of variable node components $n_{VN}$ and the predefined number of check node components $n_{CN}$ are different, i.e. $n_{VN} \neq n_{CN}$.

In another embodiment, the predefined number of variable node components $n_{VN}$ and the predefined number of check node components $n_{CN}$ are identical, i.e. $n_{VN} = n_{CN}$.

The following description of the embodiments of the invention will be made with reference to sorted and truncated variable node messages and check node messages, the number of check node components and variable node components being equal or different.

The exchange of messages between the variable node processing units 27-*vn* and the check node processing units 25-*cn* may be started by the variable node processing units 27-*vn*. The variable node messages sent to the check node processing units 25-*cn* at the start of the decoding process may comprise intrinsic messages.

The iterative decoder 123 may accordingly comprise a data processing unit 23 configured to determine intrinsic symbols and intrinsic reliability metrics from the received sequence, an intrinsic symbol denoted $x \in GF(q)$ and that belongs to the Galois field (in general to the algebraic structure of the non-binary error correcting code) being associated with an intrinsic reliability metrics denoted $I^+(x)$. The intrinsic reliability metrics may be computed from devices external to the error correcting code decoder 123. Intrinsic information can comprise the channel information.

Alternatively, in case of concatenated codes, intrinsic information can be obtained from the channel and from the output of distinct decoders.

More specifically, the data processing unit 23 may comprise:
- a symbol generator 231 configured to generate intrinsic symbols x that belong to the algebraic structure over which the non-binary error correcting code is constructed, and
- an intrinsic reliability metrics generator unit 233 configured to generate the intrinsic reliability metrics $I^+(x)$ associated with each intrinsic symbol x from the received sequence y.

Using the LLR notation of equation (2), the intrinsic reliability metrics associated with a symbol x may be determined in logarithmic scale according to:

$$I^+(x) = -\log\left(\frac{p(x = \alpha_t \mid y_i)}{p(x = \beta_i \mid y_i)}\right) \quad (3)$$

In equation (3), $\beta_i$ refers to the most reliable symbol previously defined in equation (1).

According to some embodiments, the intrinsic reliability metrics generator unit 233 may be configured to load the received signal y from a storage unit 21, the storage unit 21 being configured to store the received signal y.

A variable node processing unit 27-$vn$ may be configured to receive intrinsic reliability metrics derived from the received signal y and to receive check node messages from the check node processing units 25-$cn$ corresponding to the set $\mathcal{H}_v(vn)$. A variable node processing unit 27-$vn$ may be further configured to process the received check node messages and intrinsic reliability metrics, compute local decisions, and deliver variable node messages to at least one check node processing unit 25-$cn$ corresponding to the check nodes in the set $\mathcal{H}_v(vn)$.

A check node processing unit 25-$cn$ may be configured to process variable node messages sent by the variable node processing units 27-$vn$ corresponding to the set $\mathcal{H}_c(cn)$. A check node processing unit 25-$cn$ may be further configured to deliver check node messages to at least one variable node processing unit 27-$vn$ corresponding to the variable nodes in the set $\mathcal{H}_c(cn)$.

The decoding process may terminate either if the processed signal satisfies the parity-check equation or if a maximum number of message exchange iterations is reached without meeting all parity-check constraints.

Accordingly, the iterative decoder 123 may comprise a decoding decision unit 29 configured to receive, at each iteration of the decoding process, the local decisions computed by the variable node processing units 27-$vn$ and to:
- deliver the processed signal as an estimate of the original codeword vector if the processed signal satisfies the parity-check equation; or
- declare a decoding failure but nevertheless output the codeword vector estimated at the last iteration if a maximum number of iterations is reached without meeting all parity-check constraints.

The computation of check node messages at the level of the check node processing units can be performed according to various architectures. According to the embodiments of the invention, the check node processing units implement architectures that use elementary check node processing units such as the forward-backward architecture.

The variable node update performed at a variable node processing unit 27-$vn$ of degree $d_{VN}$ involves the use of an offset value denoted by J. The offset value is used as a default reliability metrics value for the symbols that are not included in the check node messages. A variable node processing unit 27-$vn$ of degree $d_{VN}$ is configured to receive $d_{VN}$ check node messages from the check node processing units in the set $\mathcal{H}_v(vn)$ and intrinsic information determined from the channel output, and to determine at least a variable node message by combining the received intrinsic information, the received check node message, and the offset value.

The various embodiments of the invention provide efficient low-complexity devices and methods for the determination of offset values used in variable node processing units during the variable node update step of the iterative decoding process. More specifically, the determination of the offset values according to the various embodiments is performed at each elementary check node processing unit connected to a variable node processing unit and configured to deliver a check node message to this variable node processing unit.

In check node architectures based on the use of elementary check node processing units, the computations performed by a check node processing unit are divided up into multiple elementary calculations involving multiple elementary check node processing units, each elementary check node processing unit being configured to determine an elementary check node message from a first message and a second message derived from the received variable node messages. The check node messages are constructed/determined recursively from the elementary check node messages determined by the elementary check node processors. Among the used elementary check node processing units, there is at least one elementary check node processing unit configured to send the elementary check node message to a variable node processing unit with no further processing by other elementary check node processing units. In this case, the elementary check node message computed by the elementary check node processing unit is the check node message delivered to the variable node processing unit.

The embodiments of the invention provide offset values determination devices and methods implementable in elementary check node processing units connected to variable node processing units for which the computed elementary check node message is the check node message to be delivered to the variable node processing unit connected to the elementary check node processing unit.

According to the various embodiments of the invention, a check node processing unit 25-$cn$ implements one or more elementary check node processors and is configured to determine at least one check node message based on a plurality of elementary computations performed by the one or more elementary check node processors.

The following description will be made with reference to a check node processing unit 25-$cn$ of a degree $d_{CN}$ configured to receive $d_{CN}$ variable node messages denoted by $U_1, \ldots, U_{d_{CN}}$, the check node processing unit 25-$cn$ comprising at least one elementary check node processing unit connected to a variable node processing unit 27-$vn$ in the set $\mathcal{H}_c(cn)$.

According to some embodiments using the EMS algorithm with a sorting and truncation of the check node messages and the variable node messages, each variable node message $U_i$, $i=1, \ldots, d_{CN}$ comprises $n_{VN}$ variable node components denoted by $U_i[j]=(U_i^{\oplus}[j], U_i^+[j])$ for $j=0, \ldots, n_{VN}-1$, a variable node component $U_i[j]=(U_i^{\oplus}[j], U_i^+[j])$ comprising a symbol $U_i^{\oplus}[j]$ that belongs to the Galois field GF(q) and a reliability metrics $U_i^+[j]$ associated with the symbol $U_i^\oplus[j]$. The variable node components may be sorted according to a decreasing reliability corresponding to a given order (increasing or decreasing) of the reliability metrics $U_i^+[j]$ such that $U_i^+[j] \leq U_i^+[j+1]$ (respectively $U_i^+[j] \geq U_i^+[j+1]$) for $j=0, \ldots, n_{VN}-2$ and the component comprising the most reliable symbol is $U_i[0]=(U_i^\oplus[0], U_i^+[0]=0)$ (respectively $U_i[n_{VN}-1]$) for an increasing order (respectively decreasing order) of the reliability metrics.

Without loss of generality, the following description of some embodiments will be made with reference to a decreasing reliability corresponding to an increasing order of the reliability metrics associated with the symbols, for illustration purposes only.

Figure 3:
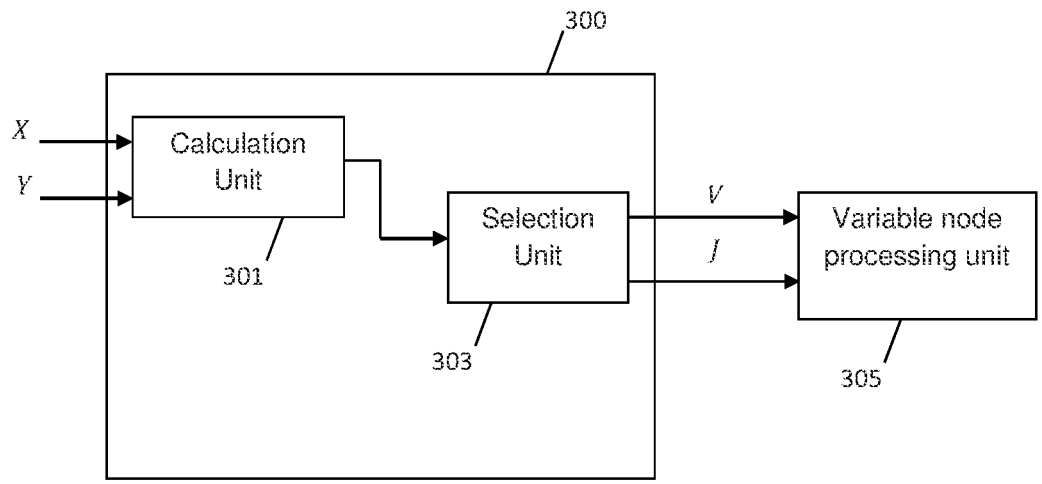
FIG. 3 is a block diagram of an elementary check node processing unit, according to some embodiments.

Referring to FIG. 3, there is provided an elementary check node processing unit 300 corresponding to at least one elementary check node processing unit implemented in the check node processing unit 25-cn and configured to:
- receive a first message denoted by X and a second message denoted by Y, the first message and the second message being derived from the received variable node messages $U_1, \ldots, U_{d_{CN}}$;
- determine an offset value denoted by J and a check node message denoted by V;
- send the determined offset value J and the check node message V to a variable node processing unit 305.

The first message X comprises a first predefined number $n_X$ of components denoted by $X[x]=(X^\oplus[x], X^+[x])$ for $x=0, \ldots, n_X-1$ and the second message Y comprises a second predefined number $n_Y$ of components denoted by $Y[y]=(Y^\oplus[y], Y^+[y])$ for $y=0, \ldots, n_Y-1$, the first and the second messages being derived from the variable node messages $U_1, \ldots, U_{d_{CN}}$. Each component of the first message and the second message may comprise a symbol and a reliability metrics associated with the symbol. The components of the first message and the components of the second message may be sorted according to a decreasing reliability corresponding to a given order (increasing or decreasing) of the reliability metrics $X^+[x]$ and $Y^+[y]$ comprised therein such that, for an increasing order of the reliability metrics:
i) $X^+[x] \leq X^+[x+1]$ for $x=0, \ldots, n_X-1$ and $Y^+[y] \leq Y^+[y+1]$ for $y=0, \ldots, n_Y-1$, and that
ii) the components comprising the most reliable symbols are respectively $X[0]=(X^\oplus[0], X^+[0]=0)$ and $Y[0]=(Y^\oplus[0], Y^+[0]=0)$.

According to some embodiments, the first message and the second message may comprise a same number of components, according to which the first predefined number and the second predefined number are equal, i.e. $n_X=n_Y$.

In another embodiment, the first message and the second message may comprise a different number of components, according to which the first predefined number and the second given predefined are different, i.e. $n_X \neq n_Y$.

According to the embodiments of the invention, the elementary check node processing unit 300 may be configured to determine the offset value J and the check node message by the determination of auxiliary components (also referred to as 'Bubbles') from the components of the first message X and the components of the second message Y.

More specifically, the embodiments of the invention provide simplified implementation of the elementary check node processing unit 300 such that the computation of the check node message, which corresponds for this elementary check node processing unit 300 to the elementary check node message computed from the first message and the second message, does not require sorting the auxiliary components as it is performed in elementary check node processors not connected to variable node processing units and in the elementary check node processors of the prior art. According to the embodiments of the invention, an elementary check node processing unit 300 connected to a variable node processing unit and configured to determine and send an elementary check node message as the check node message delivered to said variable node processing unit, may only determine the components of the check node message V by combining the components of the first message X and the components of the second message Y without applying a sorting of the resulting combinations. This means that the determined check node message V may comprise $n_V$ check node components that are not sorted at the level of the elementary check node processing unit 300 and that may be sorted later by the variable node processing unit 305 prior to performing the variable node update.

Advantageously, the embodiments of the invention enable further determining, at each elementary check node processing unit 300 connected to a variable node processing unit 305, an offset value from the auxiliary components derived from the first message and the second message received by the elementary check node processing unit 300. This enables determining a different offset value for each variable node processing unit 305 and an adaptive selection of the offset value according to a predefined decoding performance criterion.

Accordingly, and referring to FIG. 3, the elementary check node processing unit 300 may comprise a calculation unit 301 configured to determine two or more auxiliary components designated by $B_t[x][y]=(B_t[x][y]^\oplus, B_t[x][y]^+)$ for $t=1, \ldots, n_B$ from the first message X and the second message Y, with $n_B \geq 2$ designating a predefined number of auxiliary components. More specifically, the auxiliary component denoted by $B_t[x][y]=(B_t[x][y]^\oplus, B_t[x][y]^+)$ for $t=1, \ldots, n_B$ refers to the auxiliary component determined from the component $X[x]=(X[x]^\oplus, X[x]^+)$ comprised in the first message X and from the component $Y[y]=(Y[y]^\oplus, Y[y]^+)$ comprised in the second message, the index x varying in $0, 1, \ldots, n_X-1$ and the index y varying in $0, 1, \ldots, n_Y-1$. The auxiliary component $B_t[x][y]=(B_t[x][y]^\oplus, B_t[x][y]^+)$ is a component comprising:
- an auxiliary symbol designated by $B_t[x][y]^\oplus$, and
- an auxiliary reliability metrics designated by $B_t[x][y]^+$ associated with the auxiliary symbol.

The maximum possible number of auxiliary components may be given by the total number of the possible combinations of the components comprised in the first message and of the components comprised in the second message. The maximum possible number of auxiliary components may be equal to $n_X \times n_Y$.

The predefined number of auxiliary components $n_B$ may vary between a predefined number $n_V$ of the check node components comprised in the check node message V and the maximum possible number of auxiliary components $n_X \times n_Y$.

According to some embodiments, the calculation unit 301 may be configured to:
- determine the auxiliary symbol $B_t[x][y]^\oplus$ comprised in each auxiliary component $B_t[x][y]$ for $t=1, \ldots, n_B$ by applying a first addition operation over the algebraic structure of construction of the non-binary error correcting code, the first addition operation being applied to a symbol $X[x]^\oplus$ comprised in a component $X[x]=(X[x]^\oplus, X[x]^+)$ of the first message X and a symbol $Y[y]^\oplus$ comprised in a component $Y[y]$ of the second message Y according to:

$$B_t[x][y]^\oplus = X[x]^\oplus \oplus Y[y]^\oplus \quad (4)$$

For error correcting codes constructed over Galois fields, the first addition operation of equation (4) is performed over the Galois field GF(q).

determine the auxiliary reliability metrics $B_t[x][y]^+$ associated with each auxiliary symbol $B_t[x][y]^\oplus$ by applying a second addition operation over a predefined algebraic structure chosen in a group comprising the field of real numbers, the field of integer numbers, and the field of natural numbers, the second addition operation being applied to a reliability metrics $X[x]^+$ associated with a symbol $X[x]^\oplus$ comprised in a component $X[x]$ of the first message X and a reliability metrics $Y[y]^+$ associated with a symbol $Y[y]^\oplus$ comprised in a component $Y[y]$ of the second message Y according to:

$$B_t[x][y]^+ = X[x]^+ + Y[y]^+ \tag{5}$$

With the simplification of the processing at the elementary check node processing unit 300 such that no sorting of the auxiliary components is required, the structure of the calculation unit 301 may be simplified to a first adder over the algebraic structure of construction of the non-binary error correcting code (e.g. a Galois field adder for codes constructed over Galois fields) and a second adder over the predefined algebraic structured for performing the addition operation of equation (5). The simplification in terms of the removal of the sorter enables a complexity reduction, a power consumption reduction, and a latency reduction, all are due to the sorting of the auxiliary components as done in the prior art.

According to some embodiments, the elementary check node processor 300 may be configured to previously set the predefined number $n_B$ of auxiliary components depending on at least one parameter chosen in a group comprising:

the number of iterations of the messages exchanged between the check node processing unit 25-$cn$ and at least one variable node processing unit 27-$vn$ in the set $\mathcal{H}_c(cn)$, the algebraic structure of construction of the non-binary error correcting code (for example the Galois field for codes constructed over Galois fields), a signal-to-noise ratio, one or both of the first predefined number of components $n_X$ of the first message X and the second predefined number of components $n_Y$ of the second message Y, and the position of the elementary check node processor 300 within the check node processing unit 25-$cn$.

In some embodiments, the components of the first message and the second message may be received by the calculation unit 301 in serial such that at each clock cycle one component of the first message or one component of the second message is received. In other embodiments, the first message and the second message may arrive to the calculation unit 301 in parallel or in a semi-parallel way.

The determined auxiliary components may be used for determining an offset value J which is a reliability metrics value, and for determining the $n_V$ components of the check node message V to be delivered to the variable node processing unit 305. The auxiliary components may be unsorted or only partially sorted.

The embodiments of the invention enable the determination of the offset value according to the optimization of a decoding performance criterion. Accordingly, the calculation unit 301 may be configured to determine, in association with each auxiliary component $B_t[x][y]$ for $t=1, \ldots, n_B$, one or more decoding performance values according to a decoding performance criterion. Given the decoding performance values, the elementary check node processing unit 300 may further comprise a selection unit 303 configured to select, among the two or more auxiliary components $B_t[x][y]$ for $t=1, \ldots, n_B$ the auxiliary component denoted by $B_{opt}[x][y]$ that is associated with the optimal decoding performance values among the decoding performance values associated with all of the two or more auxiliary components, and determine an offset value J from the auxiliary reliability metrics $B_{opt}[x][y]^+$ comprised in the selected auxiliary component $B_{opt}[x][y]$. In one embodiment, the offset value J is assigned the value of auxiliary reliability metrics $B_{opt}[x][y]^+$ comprised in the selected auxiliary component $B_{opt}[x][y]$ (the offset value J is thus equal to the value of auxiliary reliability metrics $B_{opt}[x][y]^+$).

The elementary check node processing unit 300 may be configured to select a set of predefined number $n_V$ of auxiliary components among the determined $n_B$ auxiliary components and send the selected set of auxiliary components to the variable node processing unit 305, the transmitted auxiliary components constituting the check node components of the check node message V.

According to some embodiments, a decoding performance value may corresponds to a bit error rate or to a Frame error rate evaluated for a given signal-to-noise ratio value.

According to some embodiments, the decoding performance values associated with each auxiliary component may be evaluated using offline simulations.

Figure 4:
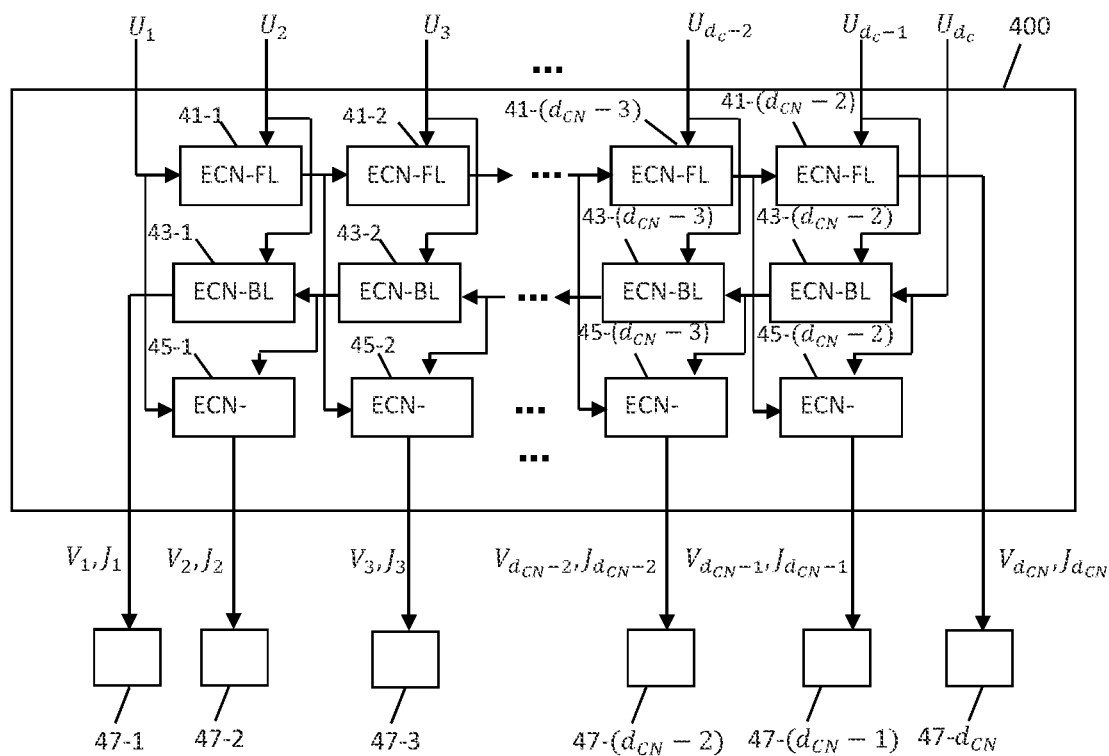
FIG. 4 is a block diagram of a check node processing unit, according to some embodiments in which a forward-backward architecture is used.

FIG. 4 is a block diagram illustrating an exemplary implementation of at least one elementary check node processing unit 300 according to the embodiments of the invention in a check node processing unit 400 of degree $d_{CN} \geq 2$ in which a forward-backward architecture is used. The check node processing unit 400 may be configured to receive $d_{CN}$ variable node messages $U_1, \ldots, U_{d_{CN}}$ and to determine, using elementary computations involving a plurality of elementary check node processing units, $d_{CN}$ check node messages denoted by $V_1, \ldots, V_{d_{CN}}$, each variable node message $V_l$ being sent to a variable node processing unit 47-$l$ for $l=1, \ldots, d_{CN}$.

Accordingly, the check node processing unit 400 may comprise ($3d_{CN}-6$) elementary check node processors partitioned into 3 categories associated with three processing layers referred to as a 'forward layer', a 'backward layer', and a 'merging layer'.

The forward layer may comprise $d_{CN}-2$ elementary check node processors ENC-FL 41-1, ..., 41-($d_{CN}-2$), among which at least an elementary check node processor ECN-FL 41-1 is configured to determine an elementary check node message from two variable node messages $U_1$ and $U_2$ (the first message and the second message corresponding each to a variable node message), each of the remaining elementary check node processors ECN-FL 41-$l$ for $l=2, \ldots, d_{CN}-2$ of the forward layer being configured to determine an elementary check node message from a first message corresponding to a variable node message and a second message corresponding to an elementary check node message determined by an elementary check node processor located at a previous stage of the forward layer. The forward layer further comprises a simplified elementary check node processing unit ECN-FL 41-($d_{CN}-2$) connected to a variable node processing unit 47-$d_{CN}$, the elementary check node processing unit ECN-FL 41-($d_{CN}-2$) being configured, according to the embodiments of the invention, to determine an offset value $J_{d_{CN}}$ and a check node message $V_{d_{CN}}$ and send them to the variable node processing unit 47-$d_{CN}$.

The backward layer comprises $d_{CN}-2$ elementary check node processors ENC-BL 43-1, ..., 43-($d_{CN}-2$), among which at least an elementary check node processor ECN-BL 43-($d_{CN}$-2) is configured to determine an elementary check node message from two variable node messages $U_{d_{CN}-1}$ and $U_{d_{CN}}$ (the first message and the second message corresponding each to a variable node message), each of the remaining elementary check node processors ECN-BL 43-$l$ for $l=2, \ldots, d_{CN}-2$ of the backward layer being configured to determine an elementary check node message from a first message corresponding to a variable node message and a second message corresponding to an elementary check node message determined by an elementary check node processor located at a previous stage of the backward layer. The backward layer further comprises a simplified elementary check node processing unit ECN-BL 43-1 connected to a variable node processing unit 47-1, the elementary check node processing unit ECN-FL 41-1 being configured, according to the embodiments of the invention, to determine an offset value $J_1$ and a check node message $V_1$ and send them to the variable node processing unit 47-1.

The merging layer may comprise $d_{cn}$-2 elementary check node processors ENC-ML 45-1, . . . , 45-($d_{CN}$-2), among which:

an elementary check node processor ECN-ML 45-($d_{CN}$-2) is configured to determine an elementary check node message from a first message $U_{d_{CN}}$ corresponding to a variable node message and a second message corresponding to an elementary check node message determined by an elementary check node processor ECN-FL 41-($d_{CN}$-3) located at the forward layer;

an elementary check node processor ECN-ML 45-1 is configured to determine an elementary check node message from a first message $U_1$ corresponding to a variable node message and a second message corresponding to an elementary check node message determined by an elementary check node processor ECN-FL 43-2 located at the backward layer;

an elementary check node processor ECN-ML 45-($d_{CN}$-2) is configured to determine an elementary check node message from a first message $U_{d_{CN}}$ corresponding to a variable node message and a second message corresponding to an elementary check node message determined by an elementary check node processor ECN-FL 41-($d_{CN}$-3) located at the forward layer;

each of the remaining elementary check node processors ECN-ML 45-$l$ for $l=2, \ldots, d_{CN}-3$ of the merging layer being configured to determine an elementary check node message from a first message corresponding to an elementary check node message determined by an elementary check node processor located in the forward layer and a second message corresponding to an elementary check node message determined by an elementary check node processor located in the backward layer.

Each of the elementary check node processors ECN-ML 45-$l$ for $l=1, \ldots, d_{CN}-2$ of the merging layer are simplified elementary check node processing units configured, according to the embodiments of the invention, to determine an offset value $J_{l+1}$ and a check node message $V_{l+1}$ and send them to the variable node processing unit 47-($l$+1), for $l=1, \ldots, d_{CN}-2$.

The embodiments of the invention may be also applied to forward-backward architectures to which a presorting of the variable node messages is applied prior to the computation at the different elementary check node processing units and to hybrid architectures mixing the forward-backward architecture with the syndrome-based architecture. Presorted forward-backward architectures are disclosed for example in the European patent application EP16305510.6 and hybrid architectures are disclosed for example in the European patent application EP17305747.2.

There is also provided a method for determining an offset value and a check node message at an elementary check node processing unit implemented in a check node processing unit of a non-binary error correcting code decoder, the offset value and the check node message being determined from a first message and a second message derived from variable node messages $U_1, \ldots, U_{d_{CN}}$ received by the check node processing unit with $d_{CN} \geq 2$, the elementary check node processing unit being connected to a variable node processing unit to which the determined offset value and check node message are to be delivered.

Figure 5:
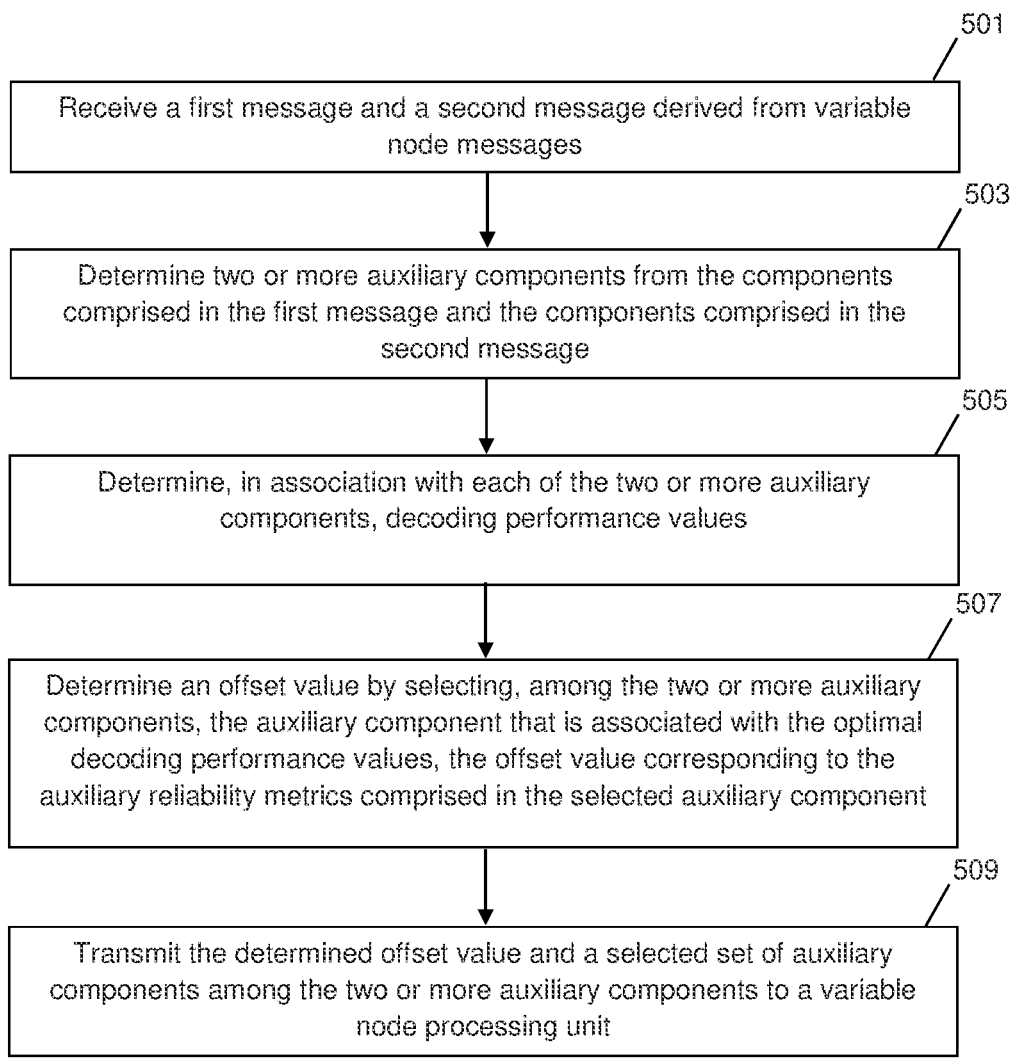
FIG. 5 is a flowchart depicting a method of determining an offset value and a check node message, according to some embodiments.

FIG. 5 is a flowchart depicting a method for determining an offset value J and a check node message V from a first message X and a second message Y according to some embodiments of the invention.

At step 501, a first message X and a second message Y may be received.

The first message X may comprise a first predefined number $n_X$ of components denoted and the second message Y may comprise a second predefined number $n_Y$ of components, the first and the second messages being derived from the variable node messages $U_1, \ldots, U_{d_{CN}}$. Each component of the first message and the second message may comprise a symbol and a reliability metrics associated with the symbol. The components of the first and second message may be sorted according to a given (increasing or decreasing) order of the reliability metrics associated with the symbols.

At step 503, two or more auxiliary components may be determined from the components comprised in the first message and the components comprised in the second message. The auxiliary component $B_t[x][y]=(B_t[x][y]^\oplus, B_t[x][y]^+)$ for $t=1, \ldots, n_B$ determined from the component $X[x]=(X[x]^\oplus, X[x]^+)$ comprised in the first message X and from the component $Y[y]=(Y[y]^\oplus, Y[y]^+)$ comprised in the second message comprises an auxiliary symbol $B_t[x][y]^\oplus$ and an auxiliary reliability metrics $B_t[x][y]^+$ associated with the auxiliary symbol.

More specifically, the auxiliary symbol $B_t[x][y]^\oplus$ comprised in each auxiliary component $B_t[x][y]$ for $t=1, \ldots, n_B$ may be determined by applying a first addition operation over the algebraic structure of construction of the non-binary error correcting code, the first addition operation being applied to a symbol $X[x]^\oplus$ comprised in a component $X[x]=(X[x]^\oplus, X[x]^+)$ of the first message X and a symbol $Y[y]^\oplus$ comprised in a component Y[y] of the second message Y according to equation (4).

The auxiliary reliability metrics $B_t[x][y]^+$ associated with each auxiliary symbol $B_t[x][y]^\oplus$ may be determined by applying a second addition operation over a predefined algebraic structure chosen in a group comprising the field of real numbers, the field of integer numbers, and the field of natural numbers, the second addition operation being applied to a reliability metrics $X[x]^+$ associated with a symbol $X[x]^\oplus$ comprised in a component X[x] of the first message X and a reliability metrics $Y[y]^+$ associated with a symbol $Y[y]^\oplus$ comprised in a component Y[y] of the second message Y according to equation (5).

At step 505, decoding performance values may be determined in association with each of the two or more auxiliary components determined at step 503.

At step 507, an offset value may be determined by selecting, among the two or more auxiliary components, the auxiliary component that is associated with the optimal decoding performance values, and setting the offset value to the auxiliary reliability metrics comprised in the selected auxiliary component.

At step 509, the determined offset value and a selected set of auxiliary components among the two or more auxiliary components determined at step 503 may be transmitted to a variable node processing unit.

The methods and devices described herein may be implemented by various means. For example, these techniques may be implemented in hardware, software, or a combination thereof. For a hardware implementation, the processing elements of an iterative decoder 123 can be implemented for instance according to a hardware-only configuration (as example, in one or more FPGA, ASIC or VLSI integrated circuits with the corresponding memory) or according to a configuration using both VLSI and DSP.

While embodiments of the disclosure have been illustrated by a description of various examples, and while these embodiments have been described in considerable detail, it is not the intent of the applicant to restrict or in any way limit the scope of the appended claims to such details.

In particular, while the description of some embodiments of the disclosure has been performed with reference to a particular implementation of the EMS algorithm, it should be noted that the disclosure may be also applied to other iterative decoding algorithms such as the min-max algorithm.

Furthermore, while some embodiments of the disclosure have been described with reference to error correcting codes constructed over Galois Fields, the skilled person will readily understand that the proposed embodiments may be also applied to any non-binary LDPC codes and any non-binary graph error correcting code constructed over non-commutative groups such as polynomial codes (e.g. cyclic codes).

Further, even if the disclosure has some advantages in an application to communication systems, it should be noted that the disclosure is not limited to such communication devices and may be integrated in numerous devices such as data storage devices.

The methods described herein can be implemented by computer program instructions supplied to the processor of any type of computer to produce a machine with a processor that executes the instructions to implement the functions/acts specified herein. These computer program instructions may also be stored in a computer-readable medium that can direct a computer to function in a particular manner. To that end, the computer program instructions may be loaded onto a computer to cause the performance of a series of operational steps and thereby produce a computer implemented process such that the executed instructions provide processes for implementing the functions specified herein.

The invention claimed is:

1. A check node processing unit implemented in a non-binary error correcting code decoder, the check node processing unit comprising:
a plurality of elementary check node processing units, the check node processing unit being configured to compute check node messages, an elementary check node processing unit being configured to receive a first message and a second message derived from variable node messages received by the check node processing unit from one or more variable node processing units in the decoder, each of the first message and the second message comprising at least two components, each component of the first message and of the second message comprising a symbol and a reliability metrics associated with the symbol, the elementary check node processing unit being configured to determine an elementary check node message from the first message and the second message, wherein the elementary check node processing unit comprises:
a calculation unit being configured, based on multiple elementary calculations, to:
determine two or more auxiliary components, comprising $n_B$ auxiliary components, from the components comprised in said first message and the components comprised in the second message, an auxiliary component comprising an auxiliary reliability metrics determined by applying addition operations to symbols and reliability metrics comprised in the components of the first and the second messages; and
determine decoding performance values, in association with each of said two or more auxiliary components;
a selection unit configured to select, among said two or more auxiliary components, the auxiliary component that is associated with optimal decoding performance values, and determine an offset value from the auxiliary reliability metrics comprised in the selected auxiliary component,
the elementary check node processing unit being further configured to transmit said offset value and an elementary check node message to a variable node processing unit, the transmitted elementary check node message comprising a number $n_y$ of auxiliary components among said two or more $n_B$ determined auxiliary components to said variable node processing unit, wherein the offset value is used as a default reliability metrics value at said variable node for the symbols that are not included in the transmitted check node message to determine at least one variable node message, and
wherein an estimate of a codeword from a sequence received from a transmitter is determined and output by the decoder using the messages exchanged between the one or more variable node processing units and the one or more check node processing units.

2. The check node processing unit of claim 1, wherein said decoding performance values comprise a bit error rate.

3. The check node processing unit of claim 1, wherein the calculation unit is configured to determine each auxiliary component among said $n_B$ auxiliary components from a component comprised in said first message and a component comprised in said second message, an auxiliary component further comprising an auxiliary symbol.

4. The check node processing unit of claim 3, wherein the calculation unit is configured to:
determine the auxiliary symbol comprised in each auxiliary component by applying a first addition operation over an algebraic structure of construction of said non-binary error correcting code, said first addition operation being applied to a symbol comprised in a component of said first message and a symbol comprised in a component of said second message, and
determine the auxiliary reliability metrics associated with each auxiliary symbol by applying a second addition operation over a predefined algebraic structure, said second addition operation being applied to a reliability metrics associated with a symbol comprised in a component of said first message and a reliability metrics associated with a symbol comprised in a component of said second message.

5. The check node processing unit of claim 4, wherein the predefined algebraic structure is chosen in a group comprising the field of real numbers, the field of integer numbers, and the field of natural numbers.

6. The check node processing unit of claim 3, wherein the first given number of components and the second given number of components are equal.

7. The check node processing unit of claim 3, wherein said first given number of components and said second given number of components are different.

8. The check node processing unit of claim 1, wherein said check node processing unit is configured to exchange two or more variable node messages with at least one variable node processing unit implemented in said non-binary error correcting code decoder during a number of message exchange iterations, the elementary check node processing unit being configured to previously determine the number of auxiliary components depending on at least one parameter chosen in a group comprising said number of message exchange iterations, an algebraic structure of construction of said non-binary error correcting code, a signal-to-noise ratio, one or more of a first predefined number of components of the first message or a second predefined number of components of the second message, and a position of the elementary check node processor within said check node processing unit.

9. The check node processing unit of claim 1, wherein the elementary check node processing unit is implemented in said check node processing unit according to a forward-backward architecture.

10. A method for determining and outputting an estimate of a codeword from a sequence received from a transmitter, the method comprising:
- determining an offset in a check node processing unit implemented in a non-binary error correcting code decoder, the check node processing unit comprising a plurality of elementary check node processing units,
- receiving a first message and a second message derived from variable node messages received by the check node processing unit from one or more variable node processing units, each of the first message and the second message comprising at least two components, each component of the first message and of the second message comprising a symbol and a reliability metrics associated with said symbol;
- determining an elementary check node message from the first message and the second message,
- determining, based on multiple elementary calculations, two or more auxiliary components from the components comprised in said first message and the components comprised in said second message, an auxiliary component comprising an auxiliary reliability metrics determined by applying addition operations to symbols and reliability metrics comprised in the components of the first and second messages;
- determining, in association with each of said two or more auxiliary components, decoding performance values;
- selecting, among said two or more auxiliary components, the auxiliary component that is associated with the optimal decoding performance values, and determining an offset value from the auxiliary reliability metrics comprised in the selected auxiliary component;
- transmitting said offset value and an elementary check node message to a variable node processing unit, the transmitted elementary check node message comprising a number $n_y$ among said two or more auxiliary components to said variable node processing unit, wherein the offset value is used as a default reliability metrics value at said variable node for the symbols that are not included in the transmitted check node message to determine at least one variable node message; and
- determining and outputting the estimate of the codeword from the sequence received from the transmitter using the messages exchanged between the one or more variable node processing units and the one or more check node processing units.

* * * * *